United States Patent
Sheng et al.

(10) Patent No.: US 7,575,045 B2
(45) Date of Patent: Aug. 18, 2009

(54) HEAT DISSIPATING DEVICE

(75) Inventors: Jian-Qing Sheng, Shenzhen (CN); Meng-Tzu Lee, Tu-Cheng (TW); Shu-Ho Lin, Tu-Cheng (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 478 days.

(21) Appl. No.: 11/092,451

(22) Filed: Mar. 29, 2005

(65) Prior Publication Data

US 2005/0247434 A1 Nov. 10, 2005

(30) Foreign Application Priority Data

Apr. 23, 2004 (CN) .................. 2004 2 0045287 U

(51) Int. Cl.
*F28D 15/00* (2006.01)
*H05K 7/20* (2006.01)

(52) U.S. Cl. .................. 165/104.21; 165/80.3

(58) Field of Classification Search .......... 165/121, 165/104.33, 104.26, 107.21, 185, 80.3, 104.21, 165/181; 361/697, 695, 700; 257/706, 722, 257/715; 174/15.2, 16.3
See application file for complete search history.

(56) References Cited

U.S. PATENT DOCUMENTS

| | | | | |
|---|---|---|---|---|
| 2,217,469 A | * | 10/1940 | Clarke | 165/181 |
| 3,645,330 A | * | 2/1972 | Albright et al. | 165/151 |
| 5,009,263 A | * | 4/1991 | Seshimo et al. | 165/151 |
| 5,077,601 A | * | 12/1991 | Hatada et al. | 257/722 |
| 5,597,038 A | * | 1/1997 | Potier | 165/121 |
| 5,815,921 A | * | 10/1998 | Burward-Hoy | 29/890.046 |
| 5,957,194 A | * | 9/1999 | Azar | 165/80.3 |
| 6,378,605 B1 | * | 4/2002 | Kutscher et al. | 165/181 |
| 6,394,175 B1 | | 5/2002 | Chen et al. | |
| 6,542,364 B2 | | 4/2003 | Lai et al. | |
| 6,625,021 B1 | * | 9/2003 | Lofland et al. | 361/697 |
| 6,725,909 B1 | * | 4/2004 | Luo | 165/104.21 |
| 6,778,392 B2 | | 8/2004 | Chiou | |
| 6,785,140 B2 | * | 8/2004 | Artman et al. | 361/709 |
| 6,802,362 B2 | * | 10/2004 | Wenger et al. | 165/80.3 |
| 6,830,098 B1 | * | 12/2004 | Todd et al. | 165/104.33 |
| 6,883,592 B2 | * | 4/2005 | Lee | 165/80.3 |
| 2001/0037875 A1 | * | 11/2001 | Guerrero | 165/80.3 |
| 2003/0024687 A1 | * | 2/2003 | Cheng et al. | 165/80.3 |
| 2003/0168208 A1 | * | 9/2003 | Sato | 165/122 |
| 2004/0035558 A1 | * | 2/2004 | Todd et al. | 165/104.26 |
| 2004/0200608 A1 | * | 10/2004 | Baldassarre | 165/181 |

FOREIGN PATENT DOCUMENTS

| | | | |
|---|---|---|---|
| TW | 471657 | * | 1/1991 |
| TW | 516666 | * | 1/2003 |
| TW | 517932 | | 1/2003 |
| TW | 248226 | | 10/2004 |

\* cited by examiner

*Primary Examiner*—Tho v Duong

(57) ABSTRACT

A heat dissipating device includes a heat receiver, a fin member arranged on the heat receiver and including a plurality of spaced fins, a plurality of heat pipes connecting the heat receiver with the fin member, and a fan located at one side of the fin member for producing airflow to the fin member. One half-bowl-shaped guiding structure is formed at each of the fins for guiding the airflow produced by the fan to blow to portions of the fin member adjacent the heat pipe.

6 Claims, 5 Drawing Sheets

HEAT DISSIPATING DEVICE

TECHNICAL FIELD

The present invention relates to heat dissipating devices, and particularly to a heat dissipating device which can efficiently dissipate heat from an electronic component.

BACKGROUND

As computer technology continues to advance, electronic components such as central processing units (CPUs), are made to provide faster operational speeds and greater functional capabilities. When a CPU operates at a high speed in a computer enclosure, its temperature frequently increases greatly. It is desirable to dissipate the generated heat of the CPU quickly, for example, by using a heat sink attached to the CPU in the enclosure. This allows the CPU in the enclosure to function within their normal operating temperature ranges, thereby assuring the quality of data management, storage and transfer.

A conventional heat sink comprises a base and a plurality of spaced fins integrally formed with the base by extrusion. The base is used for contacting with an electronic component. Heat generated by the electronic component is transferred to the base and then to the fins where heat is dissipated. However, the ratio of the height of the fins to the width of the space is limited by extrusion technology. That is, heat dissipation surface area unit volume is limited. Thus, when heat dissipation surface area is increased for meeting the increasing requirement of heat dissipation of the electronic component the volume of the heat sink is inevitably increased, which is converse to the trend toward miniaturization in computer industry.

Thus, a type of heat sink incorporating a plurality of fins stacked along a heat pipe has been developed. The fins are seperatedly formed and the heat pipe extends through the central area of the fins. The heat pipe absorbs heat from an electronic component and then transfers it to the fins for dissipation. A fan is attached to one side of the fins for producing forced airflow blowing from the border of the fins toward the central area of the fins. However, heat accumulated at the central area of the fins which has generally temperature higher than that of border area of the fins cannot be transferred efficiently. The heat dissipating efficiency of the heat sink is limited.

SUMMARY OF THE INVENTION

Accordingly, an object of the present invention is to provide a heat dissipating device which can efficiently dissipate heat from a heat generating component.

To achieve the above-mentioned objects, a heat dissipating device in accordance with a preferred embodiment of the present invention comprises a heat receiver, a fin member arranged on the heat receiver and including a plurality of spaced fins, a plurality of heat pipes connecting the heat receiver with the fin member, and a fan located at one side of the fin member for producing airflow to the fin member. One half-bowl-shaped guiding structure is formed at each of the fins for guiding the airflow produced by the fan to blow to portions of the fin member adjacent the heat pipe.

Other objects, advantages and novel features of the present invention will be drawn from the following detailed description of a preferred embodiment of the present invention with attached drawings, in which:

DETAILED DESCRIPTION OF THE INVENTION

Figure 1:
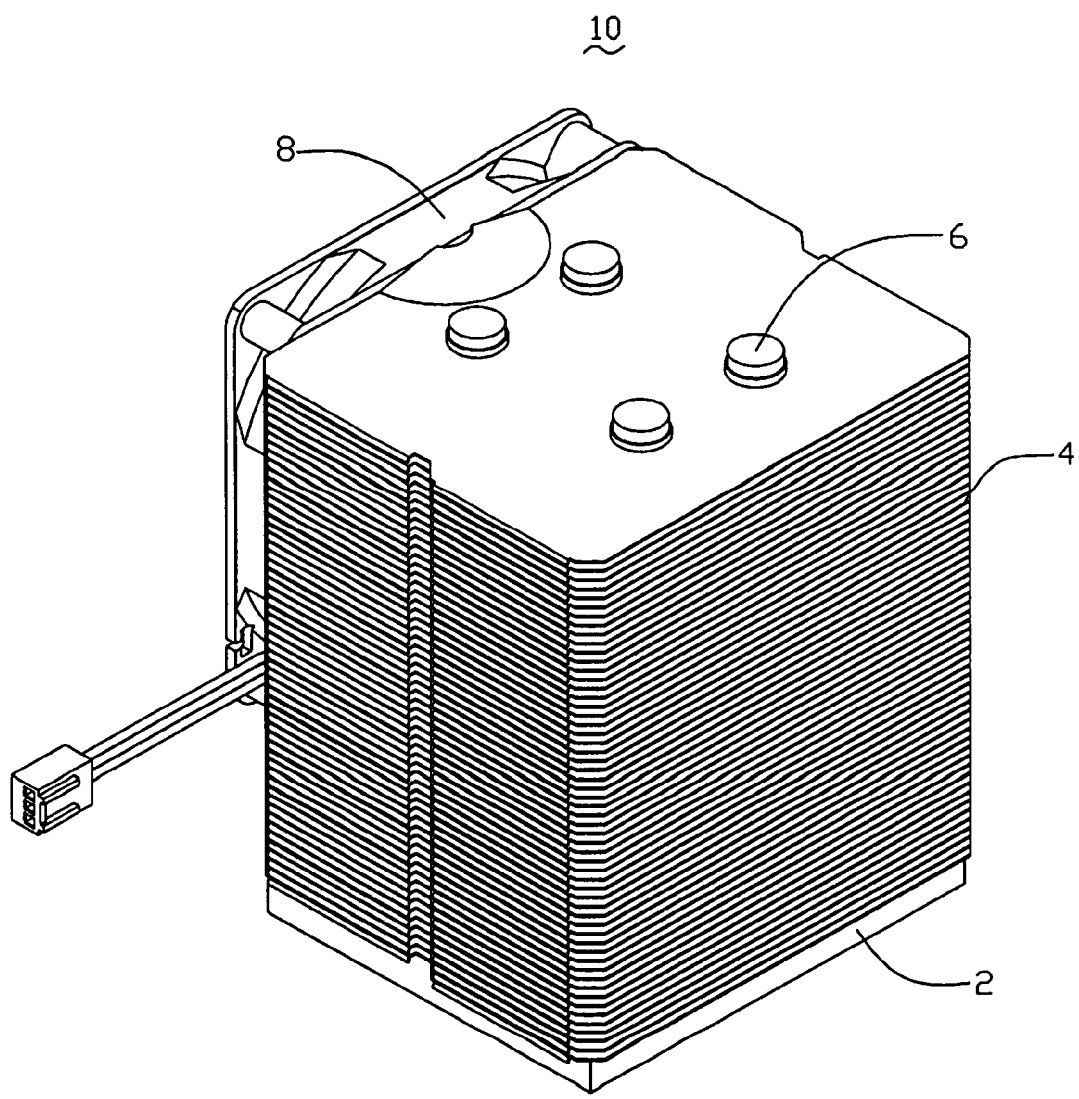
FIG. 1 is an assembled view of a heat dissipating device in accordance with a preferred embodiment of the present invention.
Figure 2:
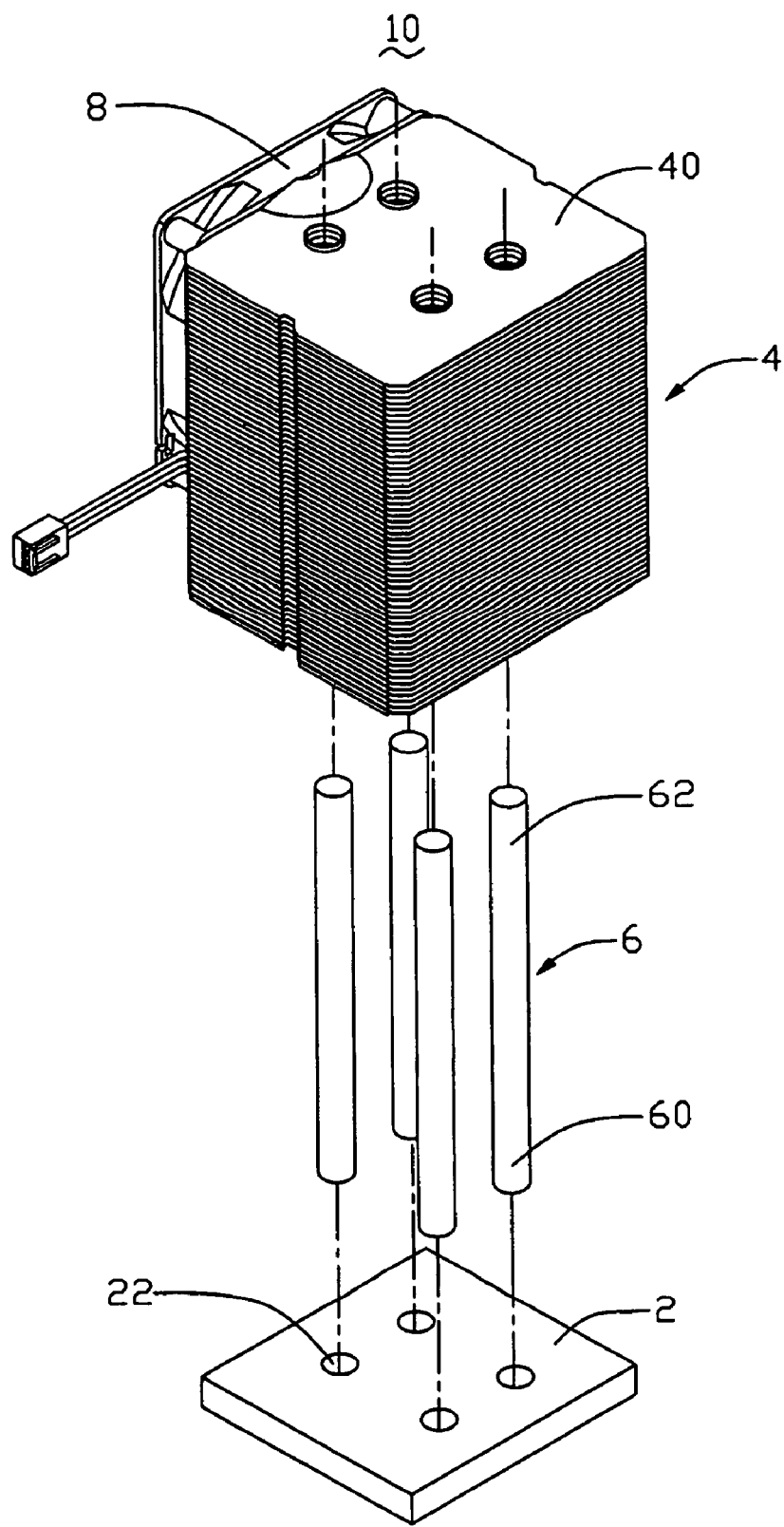
FIG. 2 is a partly exploded veiw of FIG. 1.

FIGS. 1-2 show a heat dissipating device 10 in accordance with a preferred embodiment of the present invention. The heat dissipating device 10 comprises a heat receiver 2 for absorbing heat from a heat generating component (not shown), a fin member 4 arranged on the heat receiver 2, a plurality of linear-shaped pipes 6 extending through the fin member 4 and a fan 8 attached on one side of the fin member 4.

Each heat pipe 6 comprises a vaporized section 60 and a condensed section 62. The heat receiver 2 is made of heat conductive material, such as copper. The heat receiver 2 is board-shaped and defines a plurality of holes 22 in the top surface thereof for receiving the vaporized sections 60 of the heat pipes 6 therein.

Figure 3:
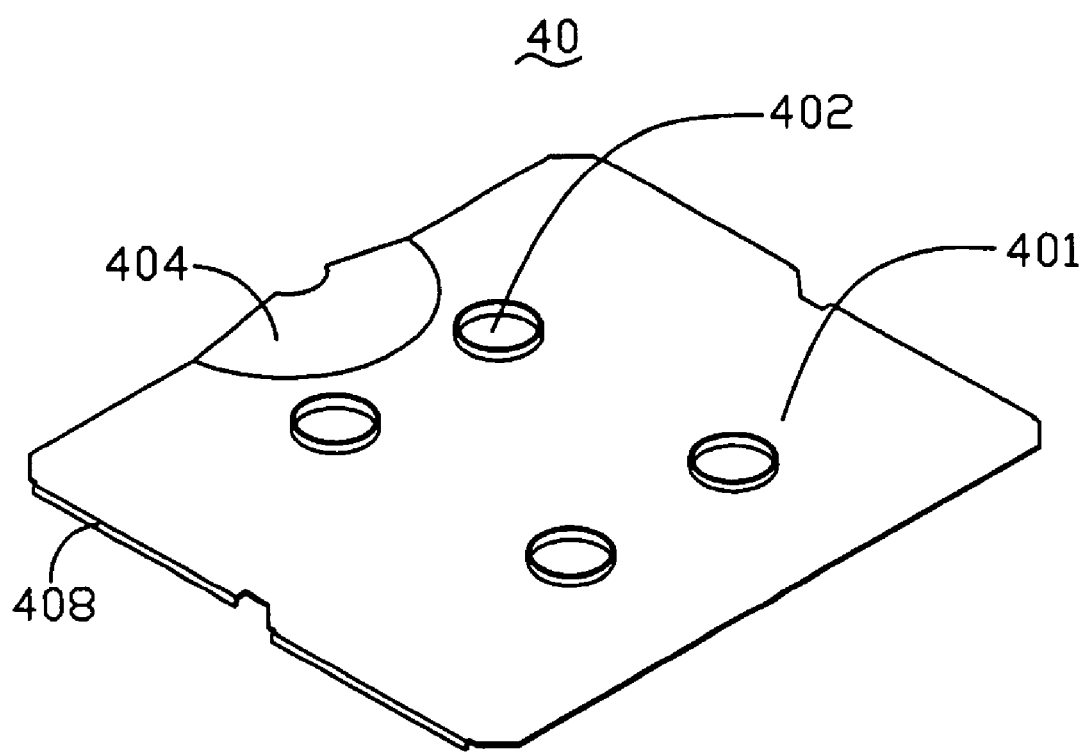
FIG. 3 is an isometric view of one fin of the dissipating device of FIG. 1.

Referring also to FIG. 3, the fin member 4 comprises a plurality of parallel fins 40. Each fin 40 comprises a board-shaped body 401 which comprises a first section located at the central area thereof and a second section located at the border area thereof surrounding the first section. A plurality of holes 402 is defined in the first section of the body 401 for extension of the heat pipes 6. An annular flange (not labeled) is formed at the body 401 surrounding each hole 402 for contacting one corresponding heat pipe 6. A guiding structure 404 is formed at the central portion of one side edge of the body 401. The guiding structure 404 is half-bowl-shaped. A pair of flanges 408 extends from another opposite side edges of the body 401 for spacing adjacent two fins 40.

In the present invention, the heat receiver 2 contacts with the heat generating component for absorbing heat therefrom. The heat pipes 6 transfer the absorbed heat from the heat receiver 2 to the fin member 4 where the absorbed heat is dissipated via the fins 40. The fan 8 produces forced airflow from the one side of the fin member 4 to the central area which the heat pipes 6 extends. The guiding structures 404 of the fins 40 are half-bowl-shaped which can guide portion of airflow to the central area of the fins 40. Thus, much more amount of airflow produced by the fan 8 is blowed to the central area of the fins 40 which has a temperature higher than that of the border area of the fins 40 since the heat pipes 6 transfer heat to the central area of the fins 40 firstly and then to the border area. Furthermore, when the airflow is blowed to the guiding structure 404 the direction of the airflow is changed to blow to the bodies 401 of the fins 40, which can increase heat exchange effect between the airflow and the fins 401. Therefore, the efficiency of the heat dissipation device 10 is improved.

Figure 4:
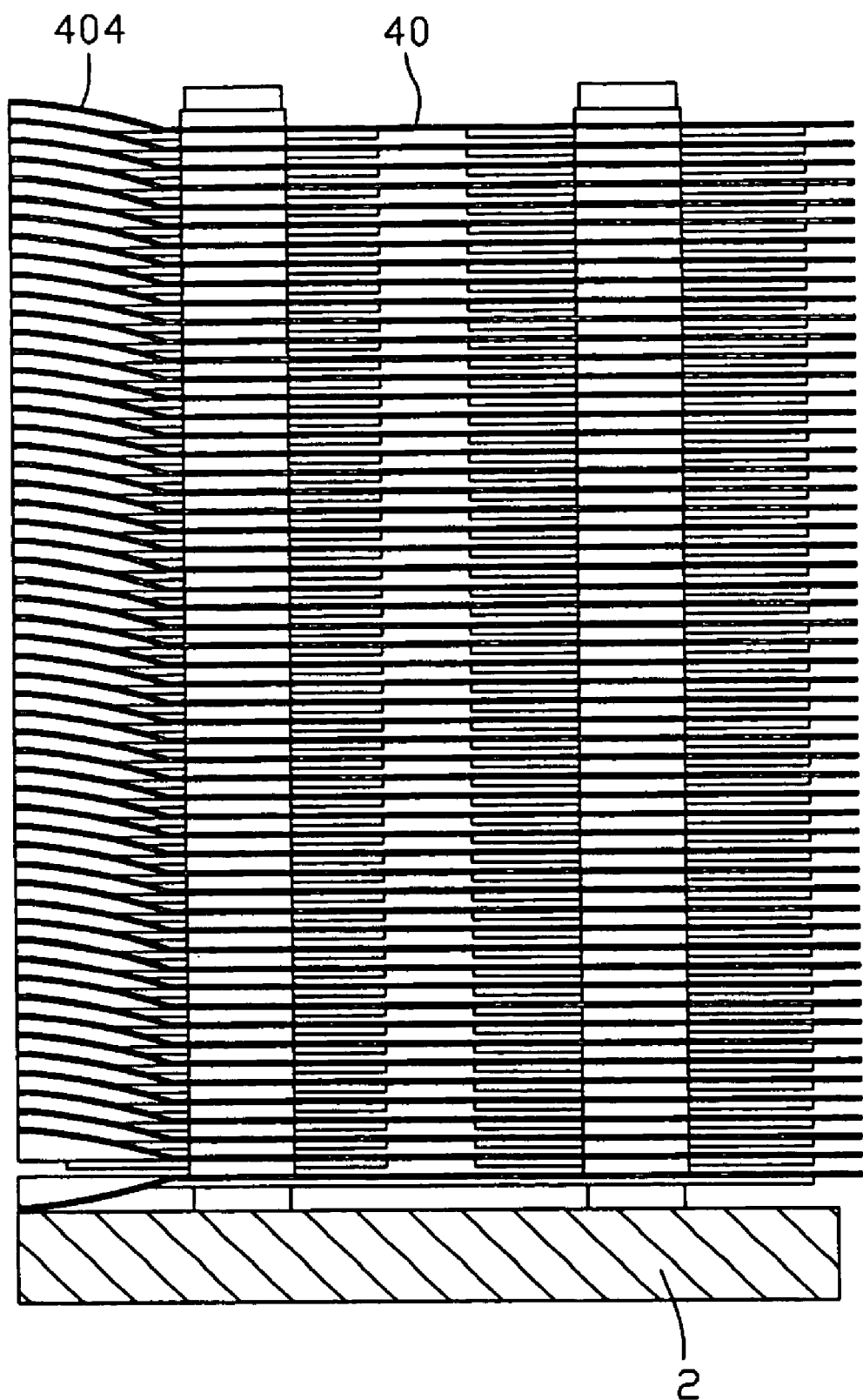
FIG. 4 is a cross-section view of a heat dissipating device in accordance with an alternative embodiment of the present invention.

FIG. 4 shows a fin member in accordance with an alternative embodiment of the present invention. In the alternative embodiment, the bottommost one of the fins 40 is arranged with the guiding structure 404 located below the body of the bottommost fin. Each of the other fins 40 is arranged with the guiding structure located above the body thereof. That is, the bottommost fin and the second bottommost fin are symmetric to each other about a plane located therebetween and parallel to the bodies of the fins 40. Thus, an enlarged guiding opening is formed between the two bottom fins which facilitates cooled airflow to blow to the two fins and bottom portions of the heat pipe to thereby improve heat dissipating efficiency of the heat dissipating device. Alternatively, the enlarged guiding opening may be formed between any two adjacent fins according to desirement and the number of the enlarged guiding opening is also not limited.

Figure 5:
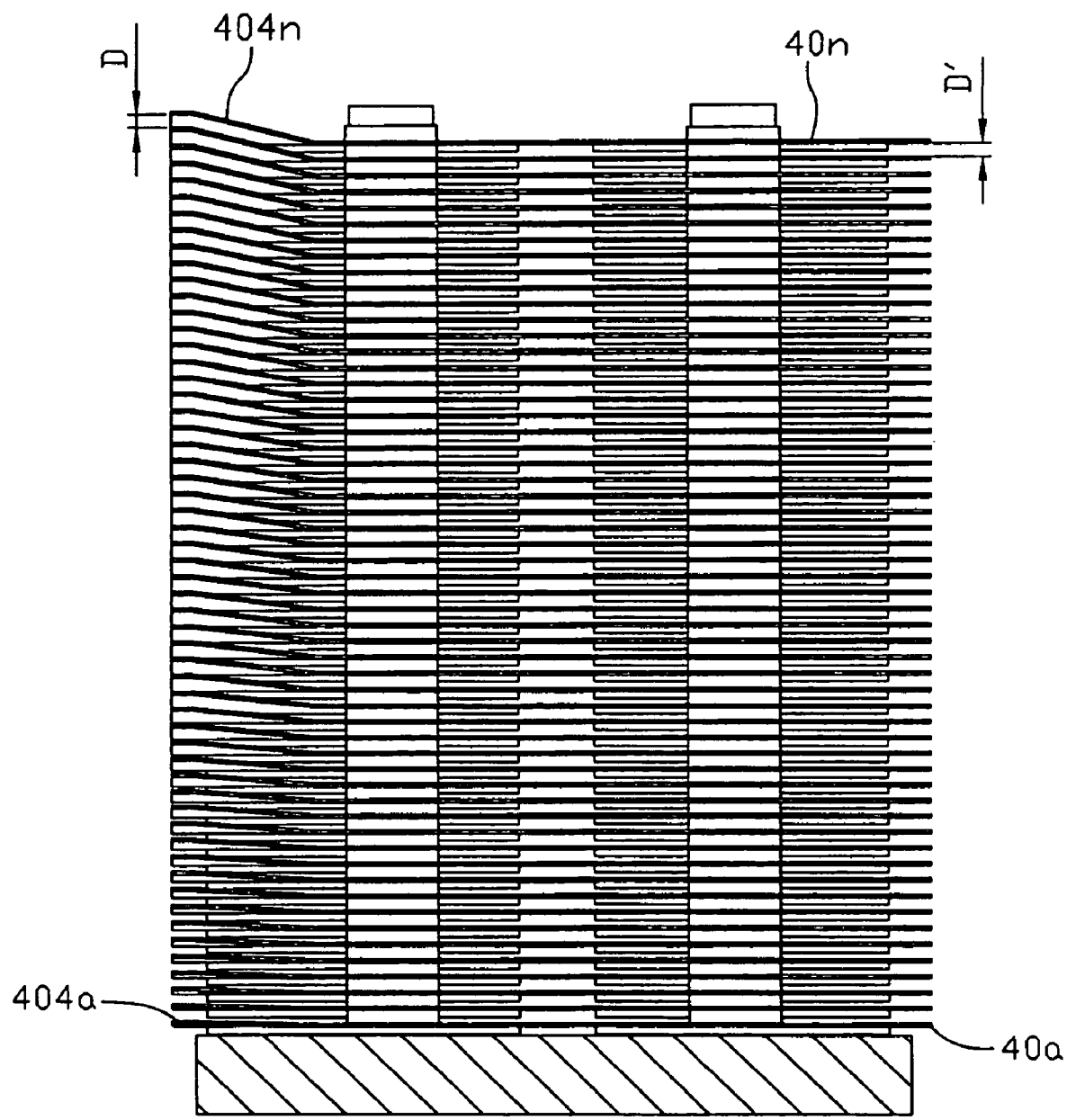
FIG. 5 is a cross-section view of a heat dissipating device in accordance with a third embodiment of the present invention.

FIG. 5 shows a fin member in accordance with a third embodiment of the present invention. In the third embodiment, the pitch of the guiding structures 404a-n of the fins 40a-40n relative to the bodies of the fins increase gradually along a direction in which the heat pipe extends. Thus, the distance D formed between the guiding structures of every two adjacent fins is larger than the distance D' formed between the bodies of the two fins which facilitates cooled airflow to blow to the bodies of the fins and the heat pipes. The distance formed between the guiding structures of any two adjacent fins are the same. Alternatively, the distance formed between the guiding structures of any two adjacent fins may be different.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A heat dissipating device comprising:
   a heat receiver;
   a fin member arranged on the heat receiver and comprising a plurality of spaced fins;
   at least one heat pipe connecting the heat receiver with the fin member; and
   a fan located at one side of the fin member for producing airflow to the fin member, wherein
   at least one guiding structure is formed at the fin member and configured for guiding the airflow to portions of the fin member adjacent said heat pipe, and
   wherein said guiding structure is half-bowl-shaped, and
   wherein each of the fins comprises a body from which the guiding structure extends, and the distance formed between the guiding structures of two adjacent fins is larger than the distance formed between the bodies of the two fins.

2. The heat dissipating device as claimed in claim 1, wherein the central area of each fin defines at least one hole, and said heat pipe extends through the holes.

3. The heat dissipating device as claimed in claim 1, wherein a pair of flanges extends from another opposite side edges of each fin with an air passage formed therebetween, the guiding structure located at an entrance of the passage.

4. The heat dissipating device as claimed in claim 1, wherein at least two adjacent fins are symmetric to each other about a plane located therebetween and an enlarged guiding opening is therefore formed between the guiding structures of said two fins.

5. The heat dissipating device as claimed in claim 1, wherein the distance formed between the guiding structures of any two adjacent fins are the same.

6. The heat dissipating device as claimed in claim 1, wherein the distance formed between the guiding structures of any two adjacent fins are different.

* * * * *